United States Patent
Miura et al.

(10) Patent No.: US 9,748,225 B2
(45) Date of Patent: Aug. 29, 2017

(54) SEMICONDUCTOR DEVICE WITH POWER TRANSISTORS COUPLED TO DIODES

(71) Applicant: Renesas Electronics Corporation, Koutou-ku, Tokyo (JP)

(72) Inventors: Yoshinao Miura, Tokyo (JP); Hironobu Miyamoto, Ibaraki (JP); Yasuhiro Okamoto, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/970,627

(22) Filed: Dec. 16, 2015

(65) Prior Publication Data
US 2016/0233211 A1   Aug. 11, 2016

(30) Foreign Application Priority Data

Feb. 6, 2015   (JP) .................................. 2015-022113

(51) Int. Cl.
*H01L 29/20* (2006.01)
*H01L 29/778* (2006.01)
(Continued)

(52) U.S. Cl.
CPC .......... *H01L 27/0629* (2013.01); *H01L 24/06* (2013.01); *H01L 24/49* (2013.01);
(Continued)

(58) Field of Classification Search
CPC ............. H01L 27/0629; H01L 27/0203; H01L 27/0207; H01L 24/06; H01L 24/49;
(Continued)

(56) References Cited

U.S. PATENT DOCUMENTS

| 6,046,470 A * | 4/2000 | Williams ............ H01L 27/0248 257/328 |
| 2002/0153585 A1* | 10/2002 | Asano ................. H01L 21/4832 257/472 |

(Continued)

FOREIGN PATENT DOCUMENTS

| JP | 2013-041976 A | 2/2013 |
| JP | 2014-110311 A | 6/2014 |

OTHER PUBLICATIONS

Zhang Yuanzhe et al., "High-Frequency Integrated Gate Drivers for Half-Bridge GaN Power Stage," 2014 IEEE 15$^{th}$ Workshop on Control and Modeling for Power Electronics (COMPEL), Jun. 22, 2014, pp. 1-9.

(Continued)

*Primary Examiner* — John C Ingham
*Assistant Examiner* — Gustavo Ramallo
(74) *Attorney, Agent, or Firm* — Shapiro, Gabor and Rosenberger, PLLC

(57) ABSTRACT

The ringing of a switching waveform of a semiconductor device is restrained. For example, an interconnect (L5) is laid which functions as a source of a power transistor (Q3) and a cathode of a diode (D4), and further functioning as a drain of a power transistor (Q4) and an anode of a diode (D3). In other words, a power transistor and a diode coupled to this power transistor in series are formed in the same semiconductor chip; and further an interconnect functioning as a drain of the power transistor and an interconnect functioning as an anode of the diode are made common to each other. This structure makes it possible to decrease a parasite inductance between the power transistor and the diode coupled to each other in series.

21 Claims, 12 Drawing Sheets

(51) Int. Cl.
*H01L 29/872* (2006.01)
*H01L 27/06* (2006.01)
*H01L 23/00* (2006.01)
*H01L 27/02* (2006.01)
*H01L 29/205* (2006.01)

(52) U.S. Cl.
CPC ...... *H01L 27/0203* (2013.01); *H01L 27/0207* (2013.01); *H01L 29/2003* (2013.01); *H01L 29/205* (2013.01); *H01L 29/7787* (2013.01); *H01L 29/872* (2013.01); *H01L 27/0605* (2013.01); *H01L 2224/0603* (2013.01); *H01L 2224/45014* (2013.01); *H01L 2224/45144* (2013.01); *H01L 2224/4846* (2013.01); *H01L 2224/4903* (2013.01); *H01L 2224/49175* (2013.01); *H01L 2924/00014* (2013.01)

(58) Field of Classification Search
CPC ............... H01L 29/2003; H01L 29/205; H01L 29/7787; H01L 29/872
See application file for complete search history.

(56) References Cited

U.S. PATENT DOCUMENTS

| | | |
|---|---|---|
| 2009/0014791 A1 | 1/2009 | Anderson et al. |
| 2010/0244050 A1 | 9/2010 | Karaguchi |
| 2013/0248931 A1 | 9/2013 | Saito et al. |

OTHER PUBLICATIONS

Extended European Search Report issued Sep. 28, 2016, in European Patent Application No. 16154420.0.

* cited by examiner

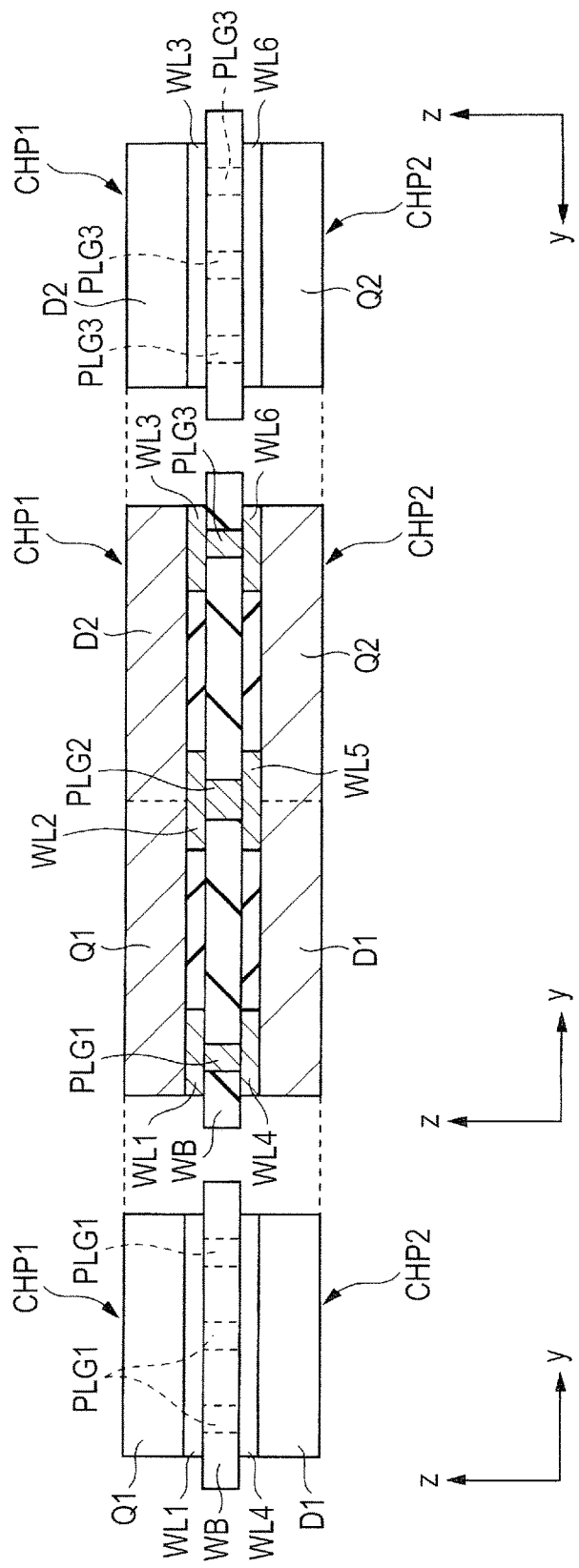

SEMICONDUCTOR DEVICE WITH POWER TRANSISTORS COUPLED TO DIODES

CROSS-REFERENCE TO RELATED APPLICATIONS

The disclosure of Japanese Patent Application No. 2015-022113 filed on Feb. 6, 2015 including the specification, drawings and abstract is incorporated herein by reference in its entirety.

BACKGROUND

The present invention relates to a semiconductor device, in particular, a technique useful for being applied to, for example, a semiconductor device including a power transistor.

Patent Literature 1 listed below describes a technique about a three-phase inverter in which a power transistor included in each arm, and a free wheel diode coupled to this power transistor in antiparallel are formed in the same semiconductor chip.

Patent Literature 1: JP 2014-110311 A

In a three-phase inverter circuit, between its power transistor and its free wheel diode that are included in a single arm, a commutation of a current (switching of a current path) is generated at the time of switching the circuit. From this matter, it is conceivable that the power transistor and the free wheel diode, which are included in the single arm, are formed in the same semiconductor chip. In this case, a parasite inductance between the power transistor and the free wheel diode can be made small so that the ringing of a waveform for the switching, which is caused by the parasite inductance, can be restrained. This manner makes it possible that the circuit realizes a high-switching action.

However, in a full bridge circuit or a half bridge circuit, the following is caused, which is different from the situation in any three-phase inverter circuit: a current commutation is generated between a diode in an upper arm (at a high-side) of the circuit and a power transistor in a lower arm (at a low-side) thereof when the circuit is switched. Thus, even in the case of applying, to a full bridge circuit or half bridge circuit, a structure in which a power transistor included in a single arm and a free wheel diode coupled to this power transistor in antiparallel are formed in the same semiconductor chip to decrease the parasite inductance, it is impossible to expect the effect of restraining the ringing of the switching waveform. In other words, in order to restrain the switching waveform ringing, which is caused by a parasite inductance, in a full bridge circuit or half bridge circuit, it is necessary to make a contrivance different from that in any three-phase inverter circuit.

Other objects and novel features of the present invention will be made evident from the description of the specification and the attached drawings.

SUMMARY

A semiconductor device of an aspect of the present invention has a power transistor, and a diode coupled to this power transistor in series in a single semiconductor chip. In the semiconductor device of the aspect, more specifically, a power transistor and a diode included in an upper arm, and a power transistor and a diode included in a lower arm are formed in a single semiconductor chip.

According to the semiconductor device of the aspect, the ringing of the switching waveform thereof can be restrained so that the device can be improved in performance by a high-speed switching action.

BRIEF DESCRIPTION OF THE DRAWINGS

FIG. 13A is a side view corresponding to a left-side side surface of the semiconductor device of Second embodiment, FIG. 13B is a sectional view of the structure of the semiconductor device, and FIG. 13C is a side view corresponding to a right-side side surface of the semiconductor device,

DETAILED DESCRIPTION

Figure 1:
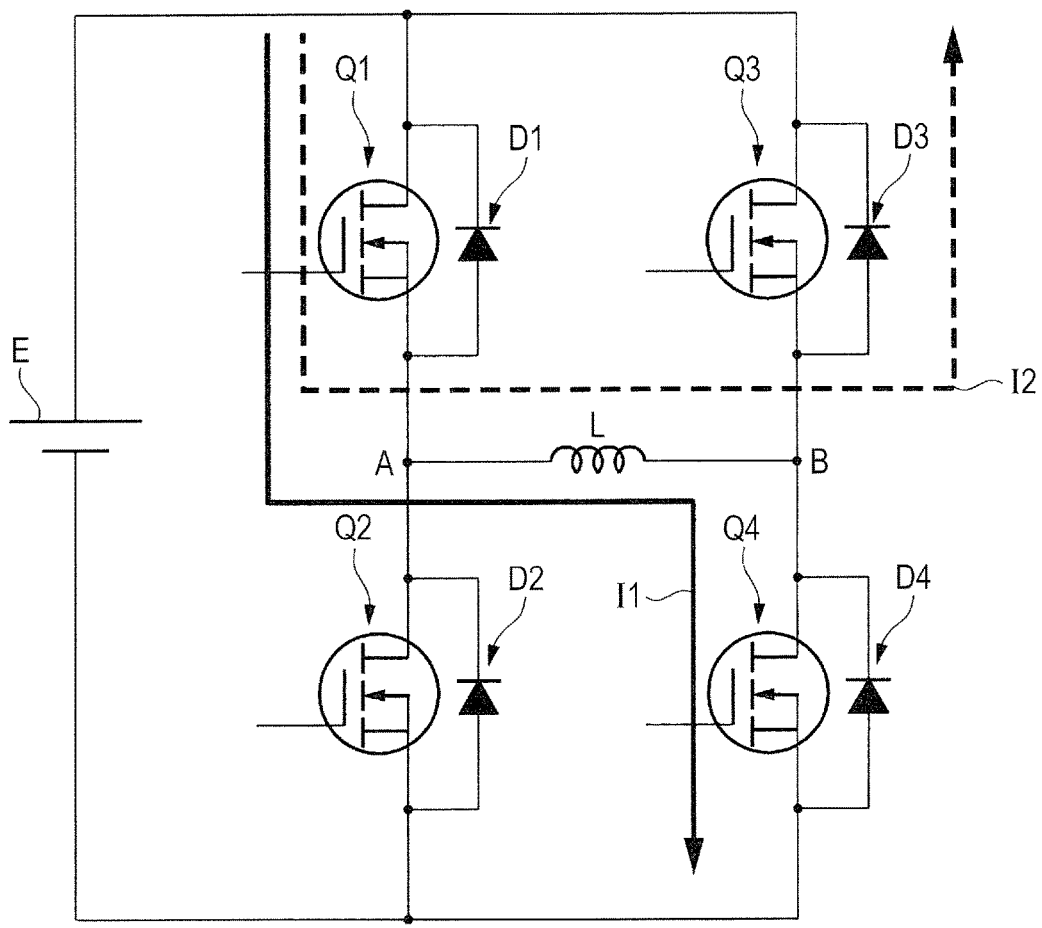
FIG. 1 is a circuit chart illustrating the structure of a full bridge circuit of Embodiment 1.

In the present item, the present invention is described in the state of being divided into plural sections or embodiments as required for convenience. These sections or embodiments are related to each other unless it is clearly stated that these are unrelated to each other. Thus, one of the sections or embodiments may have, for example, such a relation that the one is a varied example or an application example of a part or the whole of another thereof, a detailed or supplement description about the part or the whole.

In embodiments described below, in the case of referring to the number of elements, the quantity or size of an element, any property of an element, or any other, the number or the like is not limited to any specified numerical value or range thereabout that is described in the item, for example, unless it is clearly stated that the number or the like is limited to a specified numerical value or range, or unless the number or the like is clearly limited to a specified numerical value or range in light of a principle or theory concerned therewith. Thus, the number or the like may be more than or less than the described numerical value or range.

In the embodiments, any described constituent (or step) described is not essential for the present invention, for example, unless the claims recite the constituent or step, or unless the constituent or step is related to a scope equivalent theoretically to the scope of the invention according to the claims.

Similarly, when in the embodiments the shape of any constituent, a positional relationship between constituents or any other conception is referred to, the shape or the like may be substantially similar or approximate one, as well as a numerical value or range as described above, for example, unless it is clearly stated that the shape or the like is limited to specified one, or unless the shape or the like is clearly limited to specified one in light of a principle concerned therewith.

In all the drawings referred to for describing the embodiments, the same reference signs are attached, respectively, to members having the same function, and repeated description thereof is omitted. In order to make any one of the drawings easy to view or understand, hatching may be attached thereto even when the drawing is a plan view.

First Embodiment

<Structure of Full Bridge Circuit>

In the present embodiment, First embodiment, attention is paid to a switching power source used in, for example, an inverter or DC-DC converter, and, in particular, a switching power source including a full bridge circuit or a half bridge circuit will be described. The description is about an example in which the technical idea of First embodiment is applied to a full bridge circuit. However, the scope to which the idea is applied is not limited to this circuit. Thus, the technical idea is applicable to a half bridge circuit. A full bridge circuit or a half bridge circuit is used in, for example, a circuit (inverter circuit) for generating an alternating current from a direct current.

FIG. 1 is a circuit chart illustrating the structure of a full bridge circuit of First embodiment. In FIG. 1, the full bridge circuit of First embodiment is electrically coupled to a DC power source E, and has two half bridge circuits. The two half bridge circuits are coupled to each other in parallel, and further electrically coupled to the DC power source E.

Firstly, one of the two half bridge circuits has a power transistor Q1 configured as an upper arm, and a power transistor Q2 configured as a lower arm. The power transistors Q1 and Q2 are coupled to each other in series. In this case, the power transistor Q1 is arranged at a high-side (positive voltage side) of the half bridge circuit while the power transistor Q2 is arranged at a low-side (negative voltage side) thereof. A diode D1 is electrically coupled to the power transistor Q1 in antiparallel while a diode D2 is electrically coupled to the power transistor Q2 in antiparallel. In other words, a drain of the power transistor Q1 is electrically coupled to a cathode of the diode D1, and further a source of the power transistor Q1 is electrically coupled to an anode of the diode D1. In the same manner, a drain of the power transistor Q2 is electrically coupled to a cathode of the diode D2, and further a source of the power transistor Q2 is electrically coupled to an anode of the diode D2.

Secondly, the other of the two half bridge circuits has a power transistor Q3 configured as an upper arm, and a power transistor Q4 configured as a lower arm. The power transistors Q3 and Q4 are coupled to each other in series. In this case, the power transistor Q3 is arranged at a high-side (positive voltage side) of the half bridge circuit while the power transistor Q4 is arranged at a low-side (negative voltage side) thereof. A diode D3 is electrically coupled to the power transistor Q3 in antiparallel while a diode D4 is electrically coupled to the power transistor Q4 in antiparallel. In other words, a drain of the power transistor Q3 is electrically coupled to a cathode of the diode D3, and further a source of the power transistor Q3 is electrically coupled to an anode of the diode D3. In the same manner, a drain of the power transistor Q4 is electrically coupled to a cathode of the diode D4, and further a source of the power transistor Q4 is electrically coupled to an anode of the diode D4.

Furthermore, as illustrated in FIG. 1, a node A of one of the two half bridge circuits is electrically coupled through, for example, an inductor L to a node B of the other of the two half bridge circuits. As described hereinbefore, in First embodiment, the full bridge circuit is configured.

<Simple Action of Full Bridge Circuit>

The following will describe a simple action of the full bridge circuit of First embodiment. In FIG. 1, in order to cause an AC voltage to be generated between the nodes A and B from the DC power source E, there exist an action mode for producing a positive voltage component of the AC voltage, and an action mode for producing a negative voltage component of the AC voltage. Herein, a description is made about, for example, the action mode for producing a positive voltage component of an AC voltage. In FIG. 1, in the action mode for producing a positive voltage component of an AC voltage, a control is made to switch ON and OFF states of the power transistor Q4 between each other under a condition of fixing the power transistor Q1 into an ON state and further fixing the power transistors Q2 and Q3 into OFF states, respectively, (PWM control). By this PWM control, the positive component of the AC voltage can be generated between the nodes A and B. Specifically, according to the PWM control in this action mode, when the power transistor Q4 is in an ON state and the power transistor Q3 is in an OFF state, a current I1 flows in a path of the ON-state power transistor Q1→the node A→the inductor L→the node B→the power transistor Q4. Next, the power transistor Q4 is turned off. At this time, the current I1 does not come to flow. However, by the effect of the inductance existing in the inductor L, the full bridge circuit attempts to cause the current to flow continuously in a direction from the node A to the node B (current-I1-flowing direction). In this case, no current can be caused to flow from the node B to the OFF-state power transistor Q4, so that a current flows into the diode D3 coupled in antiparallel to the OFF-state power transistor Q3. In other words, when the power transistors Q3 and Q4 are each in an OFF state, a current I2 flows in a path of the ON-state-fixed power transistor Q1→the node A→the inductor L→the node B→the diode D3. Accordingly, in the full bridge circuit of First embodiment, in the mode for generating a positive voltage component of an AC voltage, it is understood that the following are alternately generated: a state that the current I1 flows in the power transistor Q4; and a state that the current I2 flows in the diode D3. In conclusion, in the full bridge circuit of First embodiment, for example, between the diode D3 of the upper arm (at the high-side) and the power transistor Q4 of the lower arm (at the low-side), a commutation of a current is generated at the switching time.

In light of this matter, in the full bridge circuit of First embodiment, the following is easily caused when such a current commutation is generated at the switching time in a case where a parasite inductance becomes large between the power transistor Q4 and the diode D3 coupled to each other in series: the ringing of a waveform for the switching, the ringing resulting from the parasite inductance. When the ringing is caused, the full bridge circuit is hindered from making a high-speed switching action. In conclusion, the inventors have found out that in order to restrain the ringing in the full bridge circuit of First embodiment to realize a high-speed switching operation in the circuit, it is necessary to decrease the parasite inductance between the power transistor Q4 and the diode D3 coupled to each other in series. In First embodiment, therefore, in order to restrain the ringing in the full bridge circuit, for example, a contrivance is made for decreasing the parasite inductance between the power transistor Q4 and the diode D3 coupled to each other in series. Hereinafter, with reference to some of the drawings, a description will be made about the technical idea of First embodiment to which this contrivance is applied.

<Points to which Attention is Paid in First Embodiment>

Figure 2:
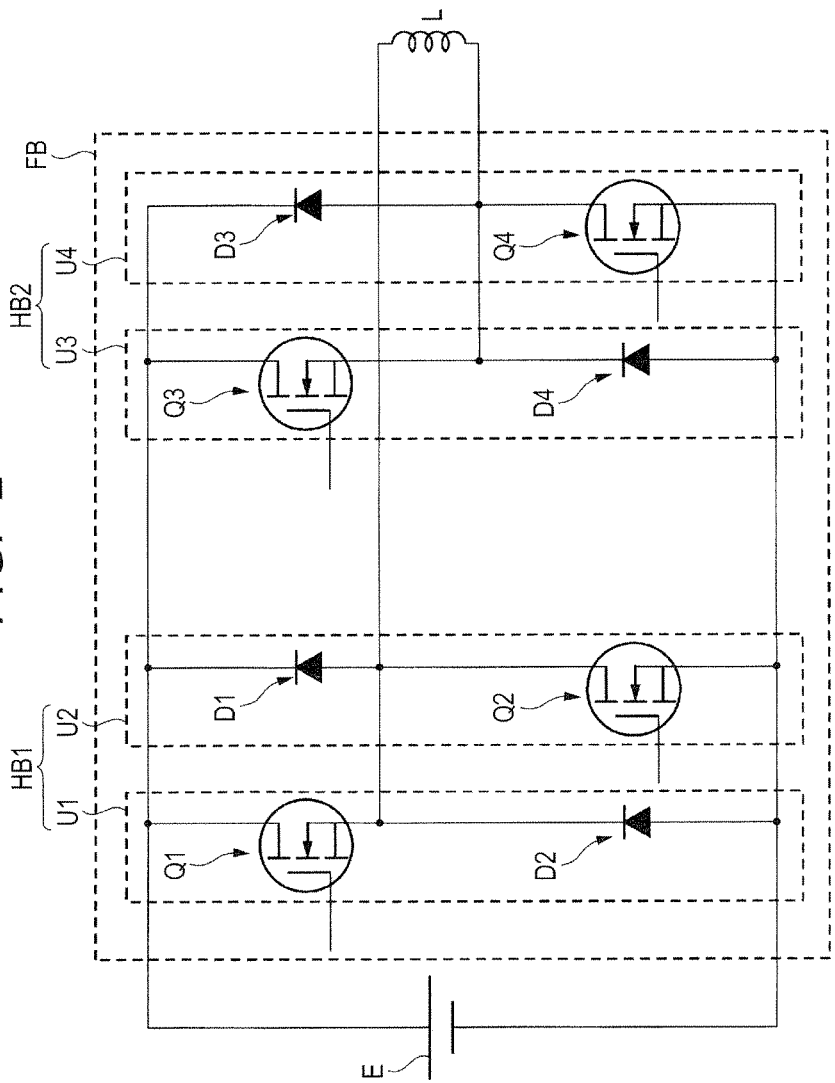
FIG. 2 is a circuit chart illustrating the full bridge circuit of First embodiment.

FIG. 2 is a circuit chart illustrating the full bridge circuit of First embodiment, which is a circuit FB. As illustrated in FIG. 2, the full bridge circuit FB of First embodiment has one of the half bridge circuits, which is a half bridge circuit HB1, and the other half bridge circuit, which is a half bridge circuit HB2. The half bridge circuit HB1 has a unitary unit U1 and a unitary unit U2. The half bridge circuit HB2 has a unitary unit U3 and a unitary unit U4.

The unitary unit U1 has the power transistor Q1 and the diode D2, which are coupled to each other in series. The unitary unit U2 has the diode D1 and the power transistor Q2, which are coupled to each other in series. In the same manner, the unitary unit U3 has the power transistor Q3 and the diode D4, which are coupled to each other in series. The unitary unit U4 has the diode D3 and the power transistor Q4, which are coupled to each other in series.

According to the above-mentioned matters, the full bridge circuit FB of First embodiment has the four unitary units U1 to U4. In First embodiment, attention is paid to the unitary units U1 to U4, and in each of the unitary units U1 to U4, a contrivance is made for decreasing a parasite inductance between the power transistor and the diode coupled to each other in series.

<Structure of Semiconductor Chip (for Full Bridge Circuit)>

Figure 3:
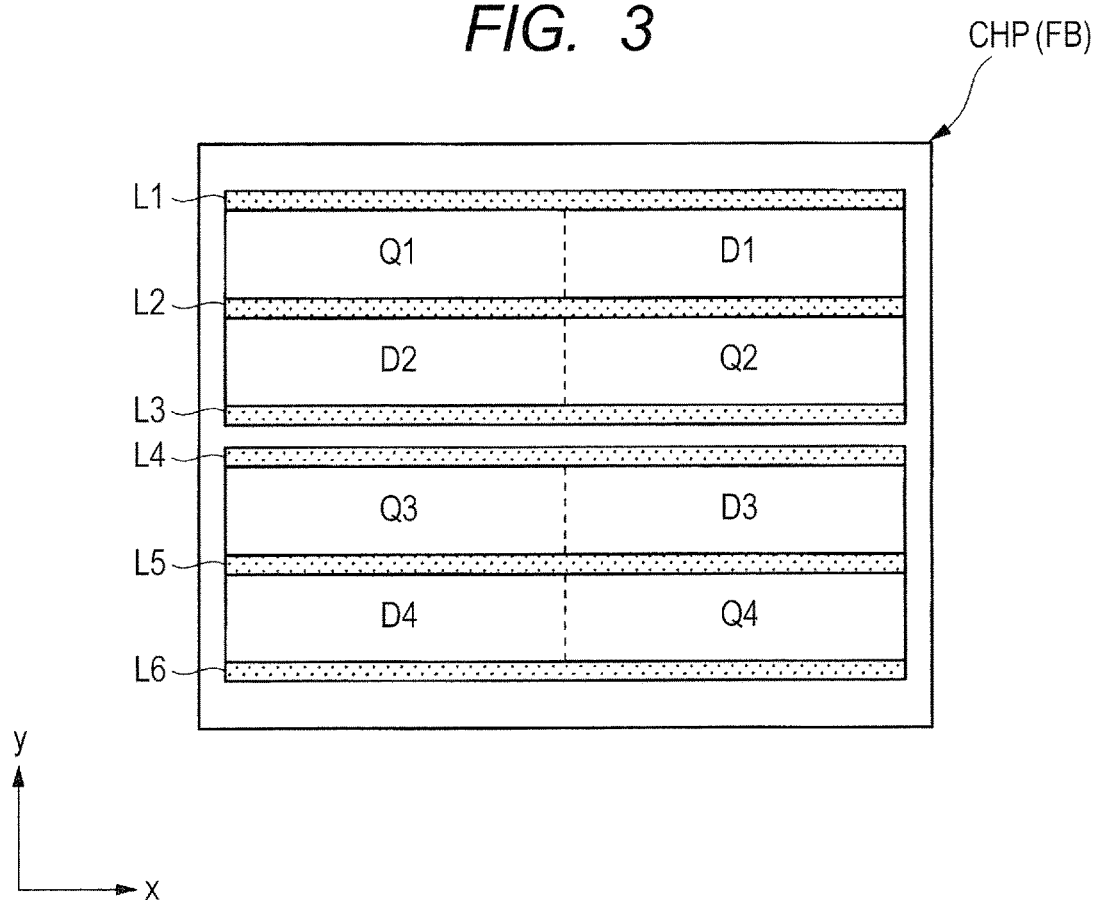
FIG. 3 is a plan view illustrating a layout structure of the semiconductor chip of First embodiment.

FIG. 3 is a plan view illustrating a layout structural example of the full bridge circuit FB of First embodiment, which is a semiconductor chip CHP 1. In FIG. 3, the semiconductor chip CHP (HB) of First embodiment is, for example, in a rectangular form. Inside the semiconductor chip CHP (HB), circuit elements that function as constituent elements of the full bridge circuit are formed.

Specifically, as illustrated in FIG. 3, in the semiconductor chip CHP (HB) of First embodiment, the power transistors Q1 and Q2, and the diodes D1 and D2 are formed. As illustrated in FIG. 3, for example, the power transistor Q1 and the diode D1 coupled to each other in antiparallel are arranged side by side in an x-direction, and furthermore the diode D2 and the power transistor Q2 coupled to each other in antiparallel are arranged side by side in the x-direction. In the meantime, the power transistor Q1 and the diode D2 coupled to each other in series are arranged side by side in a y-direction orthogonal to the x-direction, and the diode D1 and the power transistor Q2 coupled to each other in series are arranged side by side in the y-direction.

In the semiconductor chip CHP (HB) of First embodiment, as illustrated in FIG. 3, an interconnect L1 and an interconnect L2 are arranged in such a manner that the power transistor Q1 and the diode D1 are sandwiched therebetween. The interconnects L1 and L2 are each extended to the x-direction. Furthermore, the interconnect L2 and an interconnect L3 are arranged in such a manner that the diode D2 and the power transistor Q2 are sandwiched therebetween. The interconnects L2 and L3 are also each extended to the x-direction.

As described above, in the semiconductor chip CHP (HB) of First embodiment, a unit having the power transistors Q1 and Q2, the diodes D1 and D2, and the interconnects L1 to L3 is formed. This unit forms one of the two half bridge circuits, which are constituent elements of the full bridge circuit.

Furthermore, in the semiconductor chip CHP (HB) of First embodiment, a unit is formed which forms the other of the two half bridge circuits, which are the constituent elements of the full bridge circuit. In short, in the semiconductor chip CHP (HB) of First embodiment, plural units which each include constituent elements of a half bridge circuit are formed.

Specifically, as illustrated in FIG. 3, in the semiconductor chip CHP (HB) of First embodiment, the power transistors Q3 and Q4, and the diodes D3 and D4 are also formed. As illustrated in FIG. 3, for example, the power transistor Q3 and the diode D3 coupled to each other in antiparallel are arranged side by side in the x-direction, and the diode D4 and the power transistor Q4 coupled to each other in antiparallel are arranged side by side in the x-direction. In the meantime, the power transistor Q3 and the diode D4 coupled to each other in series are arranged side by side in the y-direction, which is orthogonal to the x-direction, and the diode D3 and the power transistor Q4 coupled to each other in series are arranged side by side in the y-direction.

In the semiconductor chip CHP (HB) of First embodiment, as illustrated in FIG. 3, an interconnect L4 and an interconnect L5 are arranged in such a manner that the power transistor Q3 and the diode D3 are sandwiched therebetween. The interconnect L5 and an interconnect L6 are each extended in such a manner that the diode D4 and the power transistor Q4 are sandwiched therebetween. The interconnects L5 and L6 are also each extended to the x-direction.

As described above, in the semiconductor chip CHP (HB) of First embodiment, as well as the unit (first unit) having the power transistors Q1 and Q2, the diodes D1 and D2, and the interconnects L1 to L3, a unit (second unit) having the power transistors Q3 and Q4, the diodes D3 and D4, and the interconnects L4 to L6 is formed. In First embodiment, the two units (the first unit+the second unit) form the constituent elements of the full bridge circuit.

<Structure of Semiconductor Chip (for Half Bridge Circuit)>

For example, as described above, in the semiconductor chip CHP (HB), the power transistors Q1 to Q4 and the diodes D1 to D4 can be formed, which are constituent elements of a full bridge circuit. However, considering that the full bridge circuit has two half bridge circuits, it is conceivable that in a semiconductor chip, constituent elements of a single half bridge circuit, which is a minimum unit, are formed. Thus, giving a semiconductor chip CHP (HB) in which constituent elements of a single half bridge circuit are formed, the following will describe details of a layout structure of the semiconductor chip CHP (HB).

Figure 4:
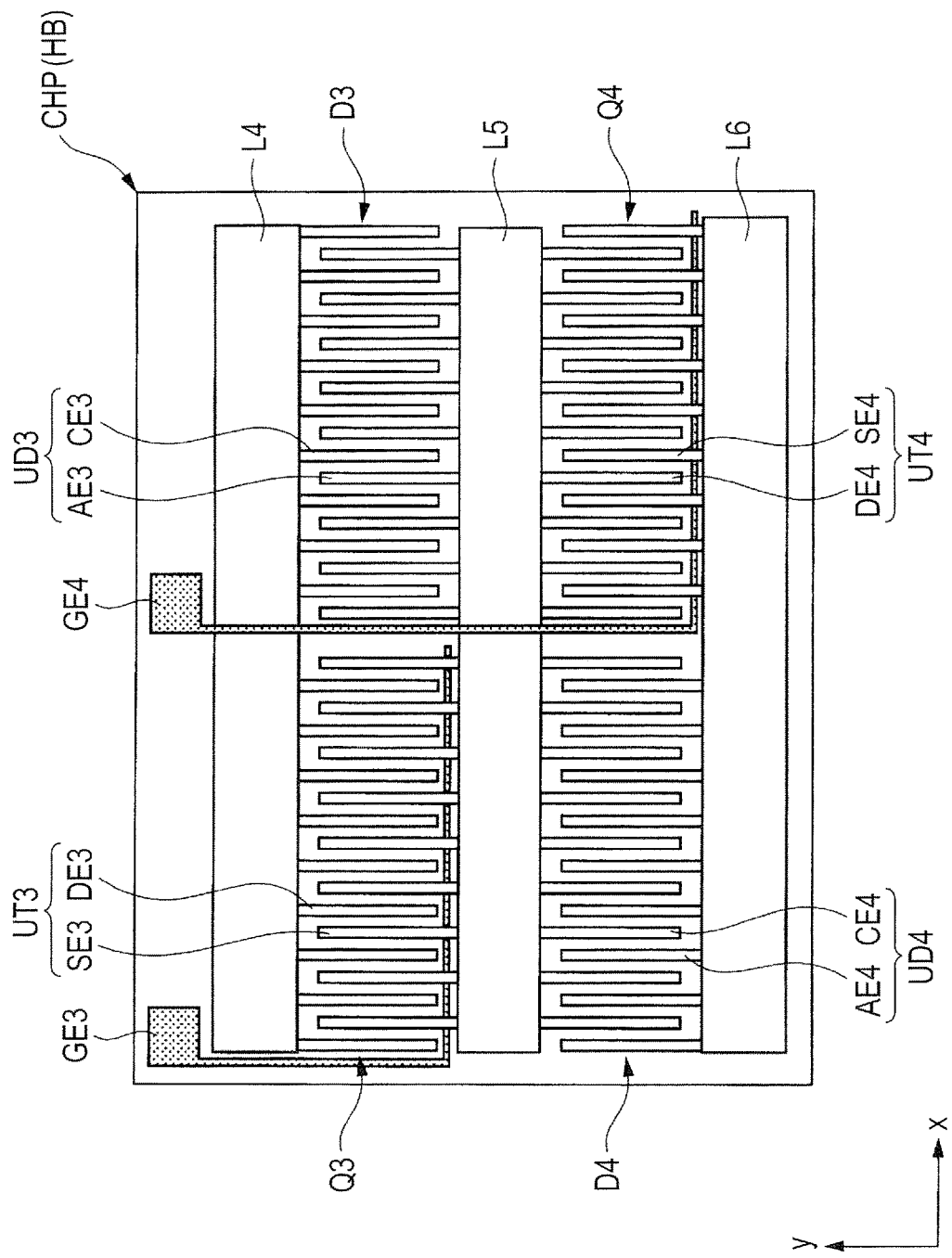
FIG. 4 is a plan view illustrating a layout structure of the semiconductor chip of First embodiment.

FIG. 4 is a plan view illustrating a layout structure example of the semiconductor chip of First embodiment. In the semiconductor chip CHP (HB) illustrated in FIG. 4, constituent elements of a half bridge circuit are formed. For example, the power transistors Q 3 and Q4 and the diodes D3 and D4 illustrated in FIGS. 1 to 3 are formed.

In FIG. 4, the semiconductor chip CHP (HB) of First embodiment is, for example, in a rectangular form. As illustrated in FIG. 4, in this semiconductor chip CHP (HB), the following are formed: the power transistor Q3; the diode D3 coupled to the power transistor Q3 in antiparallel; the diode D4 coupled to the power transistor Q3 in series; and the power transistor Q4 coupled to the diode D3 in series and coupled to the diode D4 in antiparallel.

When viewed in plan, the power transistor Q3 has a drain and a source arranged apart from each other, and a gate electrode GE3 for making ON/OFF control of a current flowing between the drain and the source. In the same manner, when viewed in plan, the power transistor Q4 also has a drain and a source arranged apart from each other, and a gate electrode GE4 for making ON/OFF control of a current flowing between the drain and the source.

In the meantime, the diode D3 has a cathode coupled electrically to the drain of the power transistor Q3, and an anode coupled electrically to the source of the power transistor Q3 and the drain of the power transistor Q4. In the same manner, the diode D4 has a cathode coupled electrically to the source of the power transistor Q3 and the drain of the power transistor Q4, and an anode coupled electrically to the source of the power transistor Q4.

Furthermore, as illustrated in FIG. 4, the semiconductor chip CHP (HB) of First embodiment has the interconnect L4, which functions as the drain of the power transistor Q3 and the cathode of the diode D3. Moreover, the semiconductor chip CHP (HB) has the interconnect L5, which functions as the source of the power transistor Q3 and the cathode of the diode D4 and further functions as the drain of the power transistor Q4 and the anode of the diode D3, and the interconnect L6, which functions as the source of the power transistor Q4 and the anode of the diode D4.

As illustrated in FIG. 4, the power transistor Q3 and the diode D3 are arranged side by side in the x-direction, and the diode D4 and the power transistor Q4 are arranged side by side in the x-direction. In the meantime, the power transistor Q3 and the diode D4 are arranged side by side in the y-direction, and the diode D3 and the power transistor Q4 are arranged side by side in the y-direction. Moreover, the interconnects L4 to L6 are extended in the x-direction to be apart from each other.

Furthermore, as illustrated in FIG. 4, the power transistor Q3 has a plurality of unitary transistors UT3 coupled to each other in parallel. When viewed in plan, each of the unitary transistors UT3, which are included in the power transistor Q3, has a drain electrode DE3 and a source electrode SE3 extended in the y-direction to be apart from each other.

In the same manner, the power transistor Q4 has a plurality of unitary transistors UT4 coupled to each other in parallel. When viewed in plan, each of the unitary transistors UT4, which are included in the power transistor Q4, has a drain electrode DE4 and a source electrode SE4 extended in the y-direction to be apart from each other.

In this case, the drain electrode DE3 of each of the unitary transistors UT3, which are included in the power transistor Q3, is electrically coupled to the interconnect L4 functioning as the drain of the power transistor Q3. The source electrode SE3 of each of the unitary transistors UT3, which are included in the power transistor Q3, is electrically coupled to the interconnect L5 functioning as the source of the power transistor Q3. In the meantime, the drain electrode DE4 of each of the unitary transistors UT4, which are included in the power transistor Q4, is electrically coupled to the interconnect L5 functioning as the drain of the power transistor Q4. The source electrode SE4 of each of the unitary transistors UT4, which are included in the power transistor Q4, is electrically coupled to the interconnect L6 functioning as the source of the power transistor Q4.

Additionally, as illustrated in FIG. 4, the diode D3 has a plurality of unitary diodes UD3 coupled to each other in parallel. When viewed in plan, each of the unitary diodes UD3 has an anode electrode AE3 and a cathode electrode CE3 extended in the y-direction to be apart from each other. In the same manner, the diode D4 has a plurality of unitary diodes UD4 coupled to each other in parallel. When viewed in plan, each of the unitary diodes UD4 has an anode electrode AE4 and a cathode electrode CE4 extended in the y-direction to be apart from each other.

The cathode electrode CE3 of each of the unitary diodes UD3, which are included in the diode D3, is electrically coupled to the interconnect L4 functioning as the cathode of the diode D3. The anode electrode AE3 of each of the unitary diodes UD3, which are included in the diode D3, is electrically coupled to the interconnect L5 functioning as the anode of the diode D3. In the meantime, the cathode electrode CE4 of each of the unitary diodes UD4, which are included in the diode D4, is electrically coupled to the interconnect L5 functioning as the cathode of the diode D4. The anode electrode AE4 of each of the unitary diodes UD4, which are included in the diode D4, is electrically coupled to the interconnect L6 functioning as the anode of the diode D4.

As described above, the layout structure of the semiconductor chip CHP (HB) of First embodiment is realized.

<Packaging Structure of Semiconductor Chip>

The following will describe a packaging structure example of the semiconductor chip CHP (HB) of First embodiment, referring to some of the drawings.

Figure 5:
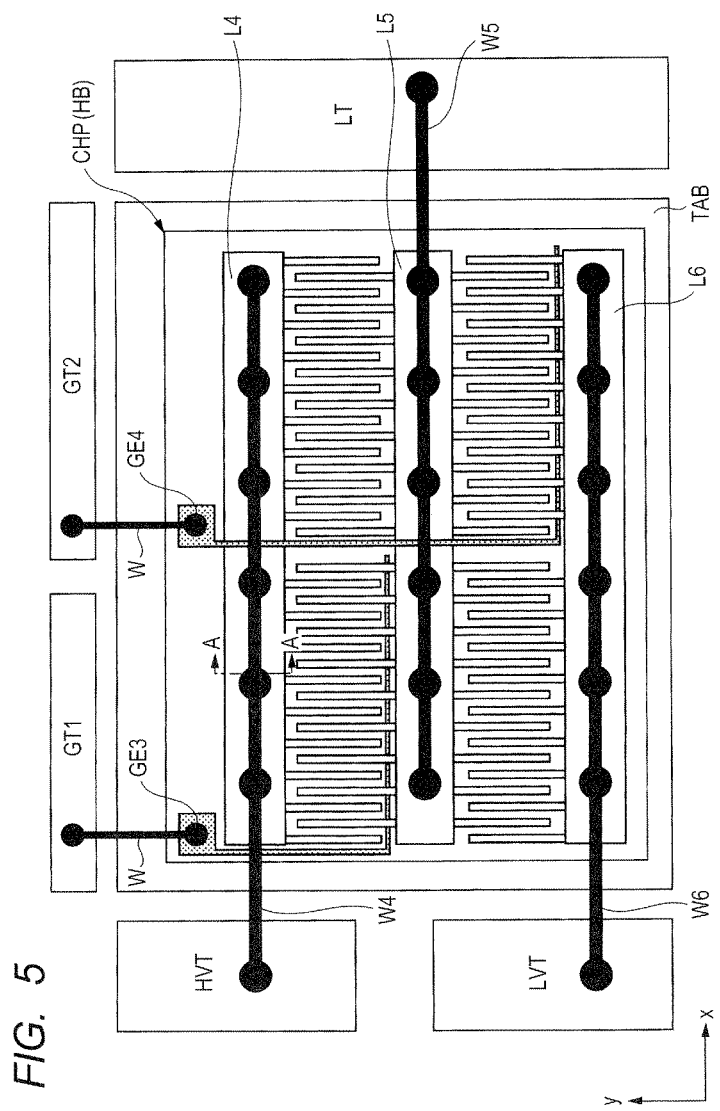
FIG. 5 is a plan view illustrating a packaging structure of the semiconductor chip of First embodiment.

FIG. 5 is a plan view of a packaging structure of the semiconductor chip CHP (HB) of First embodiment. As illustrated in FIG. 5, the semiconductor chip CHP (HB) of First embodiment is mounted on, for example, a chip mounting section TAB in a rectangular form. Around the chip mounting section TAB, the following are formed: a high-voltage terminal HVT; a low-voltage terminal LVT; a load terminal LT; a gate terminal GT1; and a gate terminal GT2. The high-voltage terminal HVT is electrically coupled to, for example, the positive voltage side (positive pole) of the DC power source E while the low-voltage terminal LVT is electrically coupled to, for example, the negative voltage side (negative pole) of the DC power source E. The load terminal LT is electrically coupled to the inductor L (load) illustrated in FIGS. 1 and 2. Furthermore, the gate terminals GT1 and GT2 are electrically coupled to, for example, a gate control circuit (PWM control circuit) not illustrated.

As illustrated in FIG. 5, the gate terminal GT1 is coupled to the gate electrode GE3 formed in the semiconductor chip CHP (HB) through a wire W that is, for example, a gold line. In the same manner, the gate terminal GT2 is coupled to the gate electrode GE4 formed in the semiconductor chip CHP (HB) through another wire W that is, for example, a gold line.

Moreover, the interconnect L4 formed in the semiconductor chip CHP (HB) is coupled to the high-voltage terminal HVT through a wire W4 that is, for example, a gold line. In the same manner, the interconnect L5 formed in the semiconductor chip CHP (HB) is coupled to the load terminal LT through a wire W5 that is, for example, a gold line. The interconnect L6 formed in the semiconductor chip CHP (HB) is coupled to the low-voltage terminal LVT through a wire W6 that is, froe a gold line.

In this case, the wire W4 is multipoint-bonded to the interconnect L4. In the same manner, the wire W5 is multipoint-bonded to the interconnect L5, and the wire W6 is multipoint-bonded to the interconnect L6.

Figure 6:
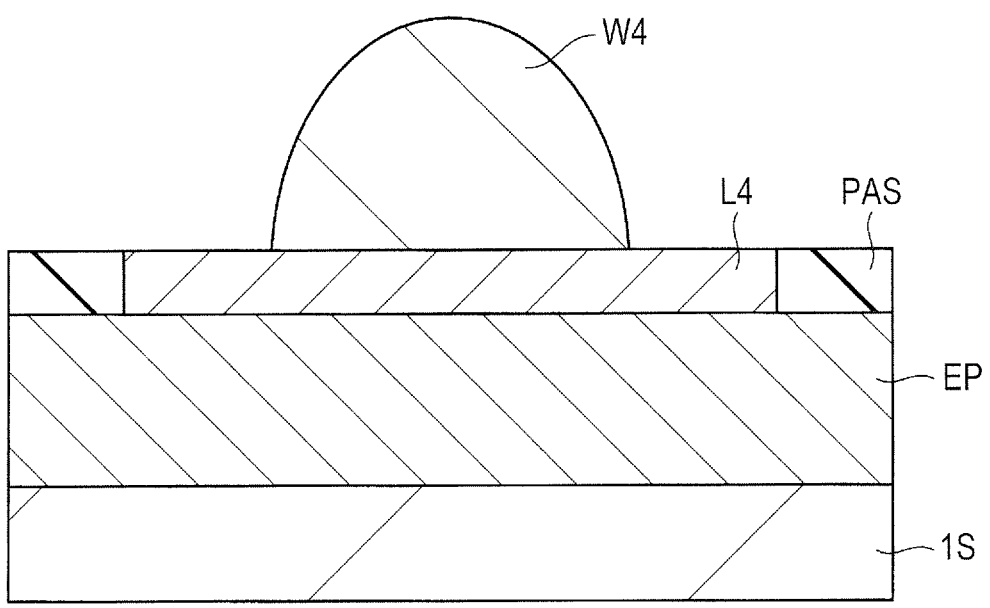
FIG. 6 is a sectional view obtained by cutting the chip on line A-A in FIG. 5.

FIG. 6 is a sectional view obtained by cutting the chip on line A-A in FIG. 5. In FIG. 6, an epitaxial layer EP is formed on a semiconductor substrate 1S. The interconnect L4, which is, for example, an aluminum film the circumstance of which is surrounded by a surface protecting film (silicon oxide film) PAS, is formed on the epitaxial layer EP. The wire W4 is bonded onto this interconnect L4, so that the interconnect L4 is electrically coupled to the wire W4.

As described above, the semiconductor chip CHP (HB) of First embodiment is packaged to be configured.

<Characteristics of First Embodiment (Characteristics of the Layout Thereof)>

Next, characteristics of First embodiment will be described. First one of the characteristics of First embodiment is a characteristic that as illustrated in, for example, FIG. 4, the interconnect L5 is laid to function as the source of the power transistor Q3 and the cathode of the diode D4, and further function as the drain of the power transistor Q4 and the anode of the diode 3. In other words, the first characteristic of First embodiment is that one of the power transistors, and the diode coupled to this power transistor in series are formed in the single semiconductor chip, and further the interconnect functioning as the drain of the power transistor and the interconnect functioning as the anode of the diode are made common to each other. According to First embodiment, this characteristic makes it possible to decrease a parasitic inductance between the power transistor and the diode coupled to each other in series. Consequently, First embodiment makes it possible to restrain the following when a current commutation is generated in the switching of the present circuit: the ringing of the switching waveform that is caused by a parasite inductance between the power transistor and the diode coupled to each other in series. In this way, First embodiment makes it possible to improve the present circuit in performance by a high-speed switching action.

Firstly, the first characteristic of First embodiment is that a power transistor included in a full bridge circuit or half bridge circuit, and a diode coupled to this power transistor in series are formed in the same semiconductor chip. In this way, this embodiment makes it possible to make the couple distance between the power transistor and the diode shorter than a case where a power transistor and a diode coupled to this power transistor in series are formed in different semiconductor chips, respectively. This matter means that a parasite inductance can be decreased between the power transistor and the diode coupled to this power transistor in series. This manner makes it possible to restrain the ringing of the switching waveform that is caused by the parasite inductance (first contrivance).

Secondly, the first characteristic of First embodiment is that, for example, the drain of the power transistor and the anode of the diode coupled to this power transistor in series are made common to each other through a single interconnect (second contrivance). In this way, First embodiment makes it possible to shorten the couple distance between the drain of the power transistor and the anode of the diode coupled to each other in series. As a result, in the circuit (which is, for example, a full bridge circuit or a half bridge circuit) in which a current commutation is generated between the power transistor and the diode coupled to each other in series, it is possible to restrain the ringing of the switching waveform that is caused by a parasite inductance between the power transistor and the diode coupled to each other in series.

As described above, it is presupposed in First embodiment to use a circuit in which a current commutation is generated between a power transistor and a diode coupled to each other in series. The first characteristic of First embodiment has a technical point that the power transistor and the diode coupled to each other in series are formed in the same semiconductor chip (the first contrivance), and another technical point that the drain of the power transistor and the anode of the diode coupled to this power transistor in series are made common to each other through a single common interconnect (the second contrivance). As a result, First embodiment makes it possible to restrain the ringing of the switching waveform that is caused by a parasite inductance by a synergic advantageous effect of the parasite-inductance-decreased effect based on the first contrivance and the parasite-inductance-decreased effect based on the second contrivance. Accordingly, the semiconductor device of First embodiment can be improved in performance by a high-speed switching action.

Furthermore, the first characteristic of First embodiment can also produce an advantageous effect that the semiconductor device can be made small in size, as well as the advantageous effect that the parasite inductance between the power transistor and the diode coupled to each other in series can be largely decreased. This is because the first characteristic of First embodiment makes it unnecessary to prepare both of a semiconductor chip in which the power transistor is formed, and a semiconductor chip in which the diode is formed by the formation of the power transistor and the diode coupled to each other in series in the same semiconductor chip. In other words, the semiconductor device of First embodiment makes it possible to decrease the number of semiconductor chips included in the semiconductor device, thereby making the semiconductor device small in size. Furthermore, according to the first characteristic of First embodiment, the drain of the power transistor and the anode of the diode coupled to this power transistor in series are made common to each other through the single common interconnect. This case makes it possible, in the structure in which the power transistor and the diode coupled to this power transistor in series are formed in the same semiconductor chip, to make a space for its interconnects smaller than any case in which a drain of a power transistor and an anode of a diode coupled to this power transistor in series are made of different interconnects, respectively. As a result, according to the first characteristic of First embodiment, the semiconductor device can be made small in size.

Furthermore, a second characteristic of First embodiment is that as has been illustrated in, for example, FIG. 5, the wire W4, through which the interconnect L4 and the high-voltage terminal HVT are coupled to each other, is multipoint-bonded to the interconnect L4. In the same manner, the second characteristic of First embodiment is also that as has been illustrated in, for example, FIG. 5, the wire W5, through which the interconnect L5 and the load terminal LT are coupled to each other, is multipoint-bonded to the interconnect L5, and further the wire W6, through which the interconnect L6 and the low-voltage terminal LVT are coupled to each other, is multipoint-bonded to the interconnect L6.

In this manner, the second characteristic of First embodiment makes it possible to decrease the couple resistance between the interconnect L4 and the high-voltage terminal HVT, that between the interconnect L5 and the load terminal LT, and that between the interconnect L6 and the low-voltage terminal LVT. As has been illustrated in FIG. 5, in First embodiment, in particular, the interconnects L4 to L6 are long extended into the x-direction; thus, by performing the multi-bonding of the wires W4 to W6, the respective couple resistances can be effectively decreased. Furthermore, by the multi-bonding of the wires W4 to W6, respective parasite inductances caused through the wires 4 to W6 can also be decreased. As a result, the second characteristic of First embodiment makes it possible to restrain the interconnect resistance and the interconnect inductance of the whole of the semiconductor device effectively to improve the semiconductor device in performance.

<Device Structure of Semiconductor Chip>

The following will describe the device structure of the semiconductor chip CHP (HB) of First embodiment. A specific description will be initially made about the device structure of the power transistors (the power transistor Q3 and the power transistor Q4) formed in the semiconductor chip CHP (HB), and subsequently a specific description will be made about the device structure of the diodes (the diode D3 and the diode D4) formed therein.

Figure 7:
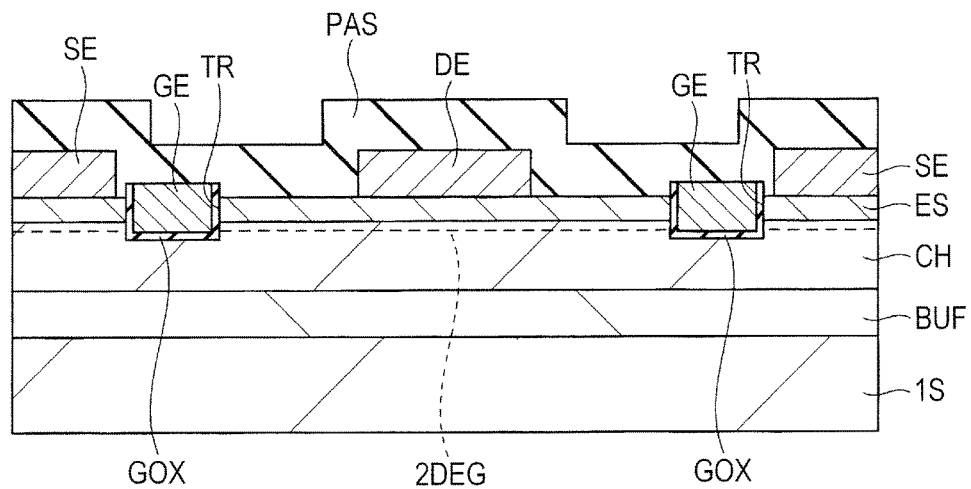
FIG. 7 is a sectional view illustrating the device structure of power transistors in First embodiment.

Nowadays, a more highly efficient use of energy has been becoming an important and urgent theme toward a low-carbon society. For example, the effect of decreasing any inverter in electric power loss can contribute to the highly efficient use of energy. Thus, the development of power transistors included in an inverter is important. Under such a research and development situation, a conversion of the material of power transistors has been investigated from Si (silicon) to GaN (gallium nitride). This is because GaN (gallium nitride) is larger than Si (silicon) in dielectric breakdown field-intensity and bandgap, and thus the use of GaN (gallium nitride) makes it possible to provide a high-performance power device capable of being decreased in ON-resistance consistently with the withstand voltage thereof. Accordingly, in First embodiment, attention is paid to power transistors in which GaN is used as a power device material. With reference to FIG. 7, the device structure of the power transistors will be described hereinafter.

FIG. 7 is a sectional view illustrating the device structure of the power transistors in First embodiment. As illustrated in FIG. 7, in each of the power transistors in First embodiment, a buffer layer BUF is formed on the semiconductor substrate 1S including, for example, silicon. A channel layer (electron transit layer) CH including, for example, GaN is formed on this buffer layer BUF. An electron supply layer ES including, for example, AlGaN is formed on the channel layer CH.

The buffer layer BUF is formed to relieve an inconsistency between the lattice spacing of Si included in the semiconductor substrate 1S, and the lattice spacing of gallium nitride (GaN) included in the channel layer CH. Specifically, when the channel layer CH including gallium nitride (GaN) is directly formed on the semiconductor substrate 1S including silicon, many crystal defects are formed in the channel layer CH so that the power transistor is lowered in performance; and in light of this matter, the buffer layer BUF is inserted between the semiconductor substrate 1S and the channel layer CH to attain lattice relief. By the formation of this buffer layer BUF, the quality of the channel layer CH formed on the buffer layer BUF can be improved, whereby the power transistor can be improved in performance.

In First embodiment, an example in which silicon (Si) is used for the semiconductor substrate 1S has been described. However, the semiconductor substrate is not limited to this example. Thus, a different substrate is usable which includes, for example, silicon carbide (SiC), sapphire ($Al_2O_3$), gallium nitride (GaN) or diamond (C).

Furthermore, as illustrated in FIG. 7, in each of the power transistors in First embodiment, a trench TR is made which is extended from the front surface of the electron supply layer ES to pass over an interface between the electron supply layer ES and the channel layer CH and further reach the channel layer CH. A gate insulating film GOX that is, for example, a silicon oxide film or an aluminum oxide film is formed onto any inner wall of the trench TR. A gate electrode GE, which is the gate electrode GE3 or GE4, is formed inside the trench TR.

As illustrated in FIG. 7, a drain electrode DE, which is the drain electrode DE3 or DE4, and a source electrode SE, which is the source electrode SE3 or SE4, are formed on the electron supply layer ES. To cover the drain electrode DE and the source electrode SE, the surface insulating film PAS that is, for example, a silicon oxide film is formed. In this case, the drain electrode DE and the source electrode SE are each, for example, an aluminum film.

In each of the power transistors in First embodiment that is configured as described above, in which the nitride semiconductor material is used, a two-dimensional electron gas 2DEG is produced near the interface between the channel layer CH and the electron supply layer ES. Specifically, a square well potential that is lower than the Fermi level is produced near the interface between the channel layer CH and the electron supply layer ES by conduction band offset based on a difference in electron affinity between the channel layer CH and the electron supply layer ES, and effects of piezoelectric polarization and spontaneous polarization existing in the channel layer CH and the electron supply layer ES. As a result, inside the square well potential, electrons accumulate, whereby the two-dimensional electron gas 2DEG is produced near the interface between the channel layer CH and the electron supply layer ES.

The reason why the trench TR in which the gate electrode GE is embedded passes over the interface between the channel layer CH and the electron supply layer ES to reach the channel layer CH is as follows: When the gate electrode GE is arranged, for example, on the electron supply layer ES, the two-dimensional electron gas 2DEG is unfavorably produced near the interface between the channel layer CH and the electron supply layer ES, this interface being just below the gate electrode GE, even in the state that no voltage is applied to the gate electrode GE. In other words, even in the state that no voltage is applied to the gate electrode GE, the power transistor turns into a normally-on state that an on-current flows in the power transistor when a voltage difference is generated between the drain electrode DE and the source electrode SE.

Specifically, in the case of using a nitride semiconductor for the channel layer CH and the electron supply layer ES, a square well potential is generated by conduction band offset between the channel layer CH and the electron supply layer ES, and further the bottom of the square well potential is pushed down by piezoelectric polarization and spontaneous polarization based on the use of the nitride semiconductor. As a result, in a case where the gate electrode GE has no trench structure, the two-dimensional electron gas 2DEG is generated near the interface between the channel layer CH and the electron supply layer ES even when no voltage is applied to the gate electrode GE. As a result, the power transistor unfavorably becomes a normally-on type device.

However, transistors for electric-power-control, typical examples of which are power transistors, are required to be normally-off type devices. Thus, as has been illustrated in FIG. 7, power transistors are suggested which each have a structure in which the gate electrode GE is embedded in the trench TR.

In the case of each of the power transistors which has the gate electrode GE having this trench structure, the interface between the channel layer CH and the electron supply layer ES is blocked by the gate electrode GE, which has the trench structure. Thus, electric conduction is not attained between the source electrode SE and the drain electrode DE through the two-dimensional electron gas when the voltage applied to the gate electrode GE is the threshold voltage or less.

In the meantime, when a voltage equal to or more than the threshold voltage is applied to the gate electrode GE in each of the power transistors in First embodiment, electrons come together to the vicinity of the bottom surface of the gate electrode GE so that an electron-accumulating region is formed. As a result, when a voltage equal to or more than the threshold voltage is applied to the gate electrode GE, electric conduction is attained between the source electrode SE and the drain electrode DE through the two-dimensional electron gas 2DEG and the electron-accumulating region. Consequently, an on-current flows from the drain electrode DE toward the source electrode SE. In other words, electron flows from the source electrode SE toward the drain electrode DE. In this way, the power transistor Q having the structure illustrated in FIG. 7 can realize a normally-off type device. In short, the gate electrode GE having the trench structure is adopted to realize a normally-off type device.

Additionally, as has been illustrated in FIG. 7, the drain electrode DE and the source electrode SE are formed on the electron supply layer ES. The electron supply layer (nitride semiconductor layer) ES is brought into ohmic contact with the drain electrode DE; and the electron supply layer (nitride semiconductor layer) ES is also done with the source electrode SE. The ohmic contact denotes resistance contact, and is defined as contact that does not have a rectification property as seen in Schottky contact.

In First embodiment, power transistors each having a trench structure have been described. However, the device structure of power transistors in the present invention is not limited to this structure. The power transistors may have, for example, an HEMT structure, in which a gate electrode is brought into Schottky contact with an electron supply layer.

Figure 8:
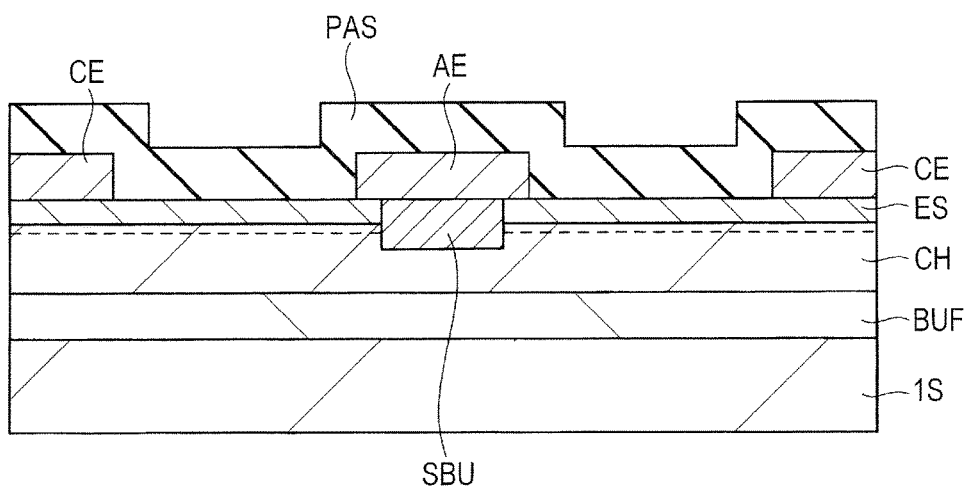
FIG. 8 is a sectional view illustrating the device structure of diodes in First embodiment.

The following will describe the device structure of the diodes formed in the same semiconductor chip in which the above-mentioned power transistors are formed, referring to FIG. 8.

FIG. 8 is a sectional view illustrating the device structure of the diodes in First embodiment. As illustrated in FIG. 8, the buffer layer BUF is formed on the semiconductor substrate 1S. The channel layer (electron transit layer) CH, which includes, for example, GaN, is formed on this buffer layer BUF. The electron supply layer ES, which includes, for example, AlGaN, is formed on the channel layer CH. In this case, the square well potential is formed in the interface between the channel layer CH and the electron supply layer ES. The anode electrode AE and the cathode electrode CE are formed on the electron supply layer ES to be apart from each other. To cover the anode electrode AE and the cathode electrode CE, the surface insulating film PAS, which is, for example, a silicon oxide film, is formed. Furthermore, as illustrated in FIG. 8, in First embodiment, as a layer underneath the anode electrode AE, a Schottky junction region SBU is formed which makes a Schottky junction with each of the channel layer CH and the electron supply layer ES. Examples of a material for forming the Schottky junction region SBU include nickel (Ni), gold (Au), platinum (Pt), tungsten (W), and p-type polysilicon (Si). The Schottky contact is defined as contact having a rectification property. Specifically, this rectification property is a property that a current is caused to flow from the anode electrode AE to the cathode electrode CE while any current is blocked from the cathode electrode CE to the anode electrode AE. As described hereinbefore, a Schottky barrier diode is formed.

<Characteristics of First Embodiment (Characteristics of the Device Structure Thereof)>

The following will describe characteristics of the device structure of First embodiment. First one of the characteristics of First embodiment is that as the power transistors, not "vertical power transistors" but "lateral power transistors" are adopted. This characteristic makes it possible to realize the characteristics of the layout of First embodiment, which have been illustrated in, for example, FIG. 4.

Firstly, this characteristic will be detailed. A "vertical power transistor" denotes a power transistor having a device structure in which a drain and a source are formed to be apart from each other in the thickness direction of a semiconductor chip. In any "vertical power transistor", for example, a source is formed at the front surface side of a semiconductor chip, and further a drain is formed at the rear surface side of the semiconductor chip so that a current flows in the thickness direction of the semiconductor chip. In the meantime, a "lateral power transistor" denotes a power transistor having a device structure in which a drain and a source are formed in a main surface of a semiconductor chip to be apart from each other when viewed in plan. In any "vertical power transistor", for example, both of a drain and a source are formed in the front surface (main surface) of a semiconductor chip so that a current flows in a direction parallel to the front surface of the semiconductor chip.

As described above, in any "vertical power transistor", a source is formed in the front surface of a semiconductor chip, and further a drain is formed in the rear surface of the semiconductor chip. This matter makes it difficult that in a single semiconductor chip, two power transistors coupled to each other in series are formed which are, for example, a power transistor configured as an upper arm of a half bridge circuit and a power transistor configured as a lower arm thereof. In other words, in, for example, two "vertical power transistors" coupled to each other in parallel, a source formed in the front surface of a semiconductor chip and a drain formed in the rear surface of the semiconductor chip are made common to each other; thus, the two power transistors can be formed in the single semiconductor chip. However, when two power transistors coupled to each other in series are configured as "vertical power transistors", it is necessary that a source at the front surface side of one of the "vertical power transistors" is coupled to a drain at the rear surface side of the other "vertical power transistor". Consequently, it is difficult to form any two "vertical power transistors" coupled to each other in series in the same semiconductor chip. The matter means that "vertical power transistors" cannot easily realize the layout of the semiconductor chip CHP (HB) of First embodiment, which has been illustrated in, for example, FIG. 4.

By contrast, in any "lateral power transistor", both of a drain and a source are formed in a surface of a semiconductor chip. This matter makes it easy that in a single semiconductor chip, two power transistors coupled to each other in series are formed which are, for example, a power transistor configured as an upper arm of a half bridge circuit and a power transistor configured as a lower arm thereof. In conclusion, when two power transistors coupled to each other in series are configured as "lateral power transistors", it is sufficient for a source at the front surface side of one of the "lateral power transistors" to be coupled to a drain of the front surface side of the other "lateral power transistor". In other words, both of the source of the one of the "lateral power transistors" and the drain of the other "lateral power transistor" are present at the same surface side of the chip. This matter makes it easy that any two "lateral power transistors" coupled to each other in series are formed in a single semiconductor chip. Consequently, the adoption of "lateral power transistors" makes it possible to realize the layout of the semiconductor chip CHP (HB) of First embodiment, which has been illustrated in, for example, FIG. 4. In other words, precisely because "lateral power transistors" are adopted as power transistors, the layout in First embodiment, which has been illustrated in FIG. 4, can be realized.

The layout in First embodiment, which has been illustrated in FIG. 4, is useful for a case where "GaN power transistors" are adopted as the "lateral power transistors". Hereinafter, this point will be detailed.

About, for example, "Si power transistors", the main current thereof is "vertical power transistors", which can improve the integration degree of cells and can be decreased in ON-resistance, and further in the light of the device structure thereof, body diodes are necessarily formed. Accordingly, about "Si power transistors", it is low in usefulness that: it is presupposed that the transistors are "vertical power transistors"; and further the layout illustrated in FIG. 4 is used, in which the power transistors are formed as constituent elements different from the diodes.

By contrast, about each of the "GaN power transistors", as has been illustrated in FIG. 7, the use of the two-dimensional electron gas 2DEG located near the interface between the channel layer CH and the electron supply layer ES necessarily renders the present transistor a "lateral power transistor". Furthermore, in light of the device structure thereof, no body diode is formed. Thus, about the "GaN power transistors", because of the two points that these transistors are "lateral power transistors" and that no body diode is formed, it is highly useful that: it is presupposed that the transistors are "lateral power transistors"; and further the layout illustrated in FIG. 4 is used, in which the power transistors are formed as constituent elements different from the diodes.

When the layout illustrated in FIG. 4 is realized while the "GaN power transistors" are adopted, First embodiment makes it possible to restrain the ringing of the switching waveform, which is caused by a parasite inductance between each of the power transistors and the diode coupled thereto in series, while the ON-resistance-decrease and the withstand voltage are made compatible with each other by the "GaN power transistors". By this matter, First embodiment can produce a remarkable advantageous effect that a high-performance power device can be provided.

Secondly, second one of the characteristics of the device structure of First embodiment is that the diodes mounted in the same semiconductor chip in which the power transistors are formed are rendered Schottky barrier diodes. This characteristic makes it possible to decrease the semiconductor device of First embodiment in consumed electric power. Specifically, Schottky barrier diodes have a property of being smaller in forward-direction voltage drop than pn junction diodes. Therefore, for example, in the semiconductor device of First embodiment, a current commutation is generated at the time of the switching thereof, so that a current flows into each of the diodes. However, by the use of Schottky barrier diodes, which are small in forward-direction voltage drop, an electric power consumption based on current-flowing into the diodes can be decreased.

The above-mentioned matters make it possible that the semiconductor device of First embodiment produces an excellent advantageous effect that a high-performance power device is provided by a synergetic advantageous effect of the layout characteristics and the device structure characteristics.

<Modified Example>

Figure 9:
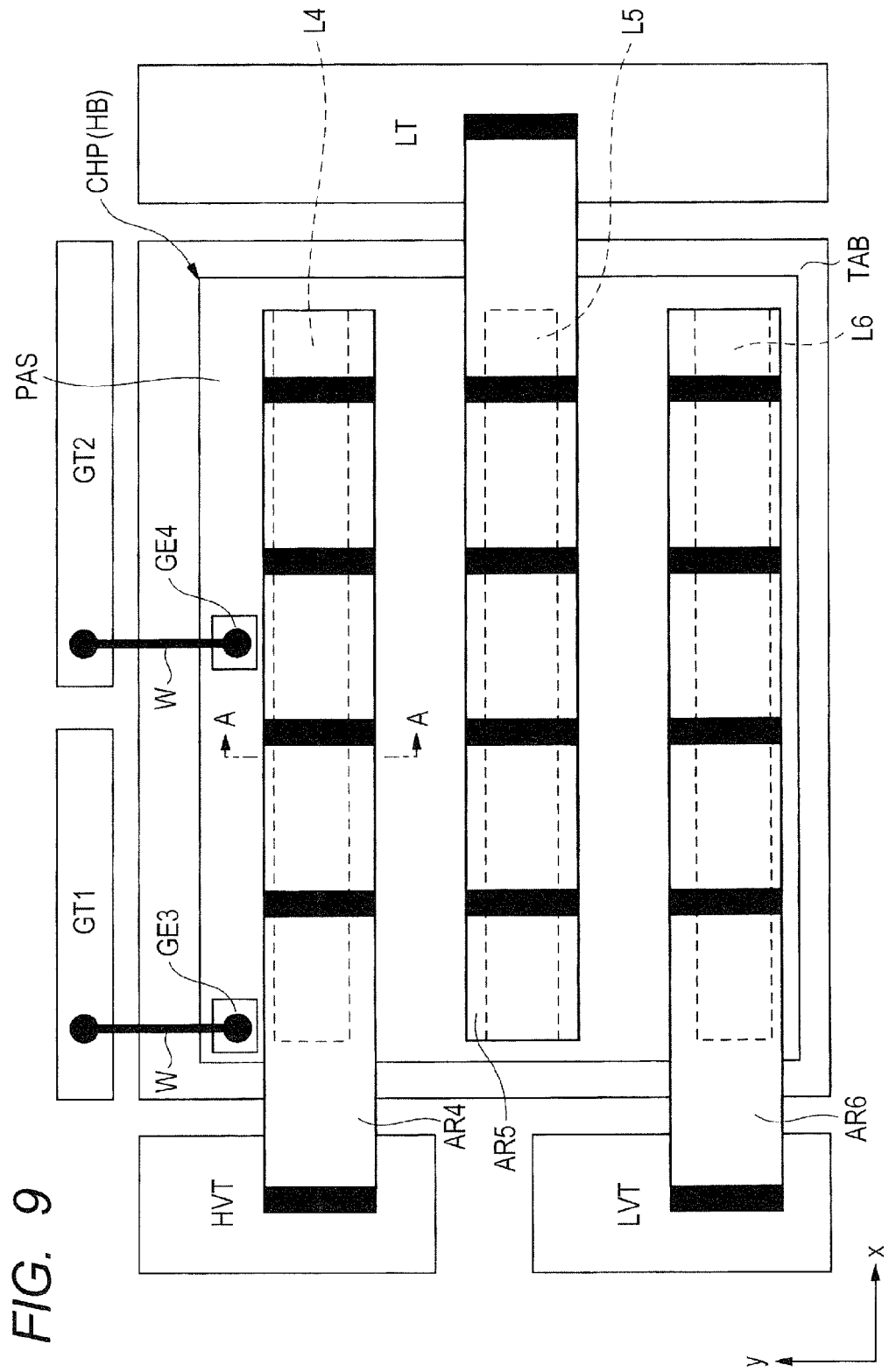
FIG. 9 is a plan view illustrating a packaging structure of a semiconductor chip of a modified example.
Figure 10:
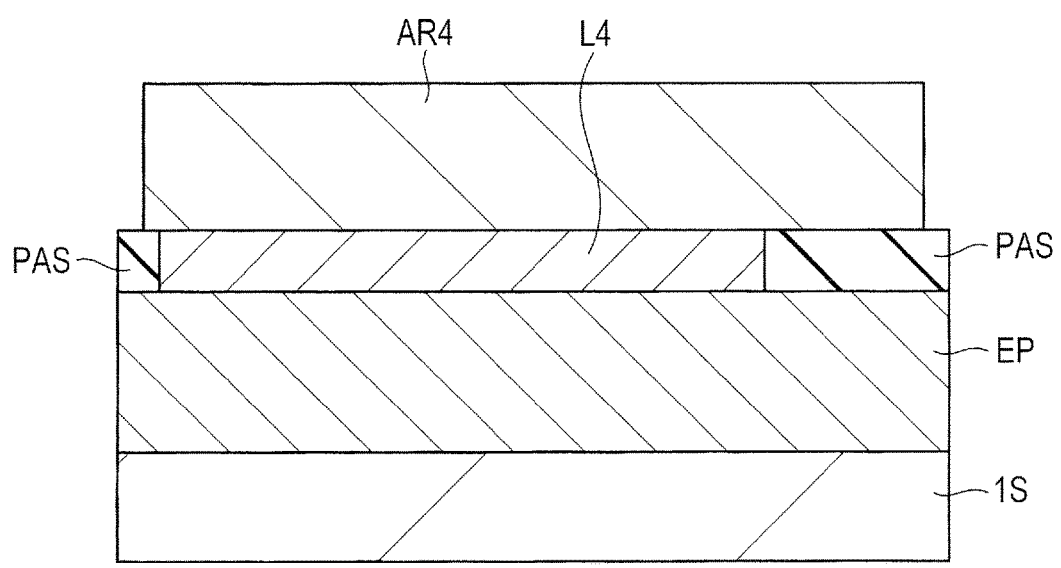
FIG. 10 is a sectional view obtained by cutting the packaging structure on line A-A in FIG. 9.

The following will describe a modified example of the packaging structure of the semiconductor chip CHP (HB) of First embodiment, referring to FIGS. 9 and 10. FIG. 9 is a plan view illustrating a packaging structure of a semiconductor chip CHP (HB) of the present modified example. As illustrated in FIG. 9, in the modified example, interconnects L4 to L6 are extended in an x-direction to be apart from each other while naked from a surface protecting film PAS. An aluminum ribbon AR4 (first conductive member) is formed which is extended in the x-direction and electrically coupled to the interconnect L4 while arranged from an upper region of the interconnect L4 to an upper region of the surface protecting film PAS. Furthermore, an aluminum ribbon AR5 (second conductive member) is formed which is extended in the x-direction and electrically coupled to the interconnect L5 while arranged from an upper region of the interconnect L5 to an upper region of the surface protecting film PAS. In the same manner, an aluminum ribbon AR6 (third conductive member) is formed which is extended in the x-direction and electrically coupled to the interconnect L6 while arranged from an upper region of the interconnect L6 to an upper region of the surface protecting film PAS.

FIG. 10 is a sectional view obtained by cutting the packaging structure on line A-A in FIG. 9. As illustrated in FIG. 10, an epitaxial layer EP is formed on a semiconductor substrate 1S. On this epitaxial layer EP, for example, the interconnect L4 is formed, which is an aluminum film the circumstance of which is surrounded by the surface protecting film (silicon oxide film) PAS. The aluminum ribbon AR4 is bonded onto this interconnect L4, and is electrically coupled to the interconnect L4. As described hereinbefore, the semiconductor chip CHP (HB) of the modified example is packaged and configured.

The aluminum ribbon AR4 is larger in width and lower in resistance value than a wire, in the example, corresponding to the wire W4 in FIG. 5; thus, the couple resistance between a high-voltage terminal HVT (in FIG. 9) and the interconnect L4 can be further decreased. In the same manner, the aluminum ribbon AR5 is larger in width and lower in resistance value than a wire, in the example, corresponding to the wire W5 in FIG. 5; thus, the couple resistance between a load terminal LT (in FIG. 9) and the interconnect L5 can be further decreased. Additionally, the aluminum ribbon AR6 is larger in width and lower in resistance value than a wire, in the example, corresponding to the wire W6 in FIG. 5; thus, the couple resistance between a low-voltage terminal LVT (in FIG. 9) and the interconnect L6 can be further decreased (first advantage). Moreover, in the modified example, the aluminum ribbon AR4 is multipoint-bonded to the interconnect L4, the aluminum ribbon AR5 is multipoint-bonded to the interconnect L5, and further the aluminum ribbon AR6 is multipoint-bonded to the interconnect L6 (second advantage). As a result, the modified example makes it possible to decrease the semiconductor device further in parasite resistance by a synergetic advantageous effect of the first and second advantages.

Figure 11:
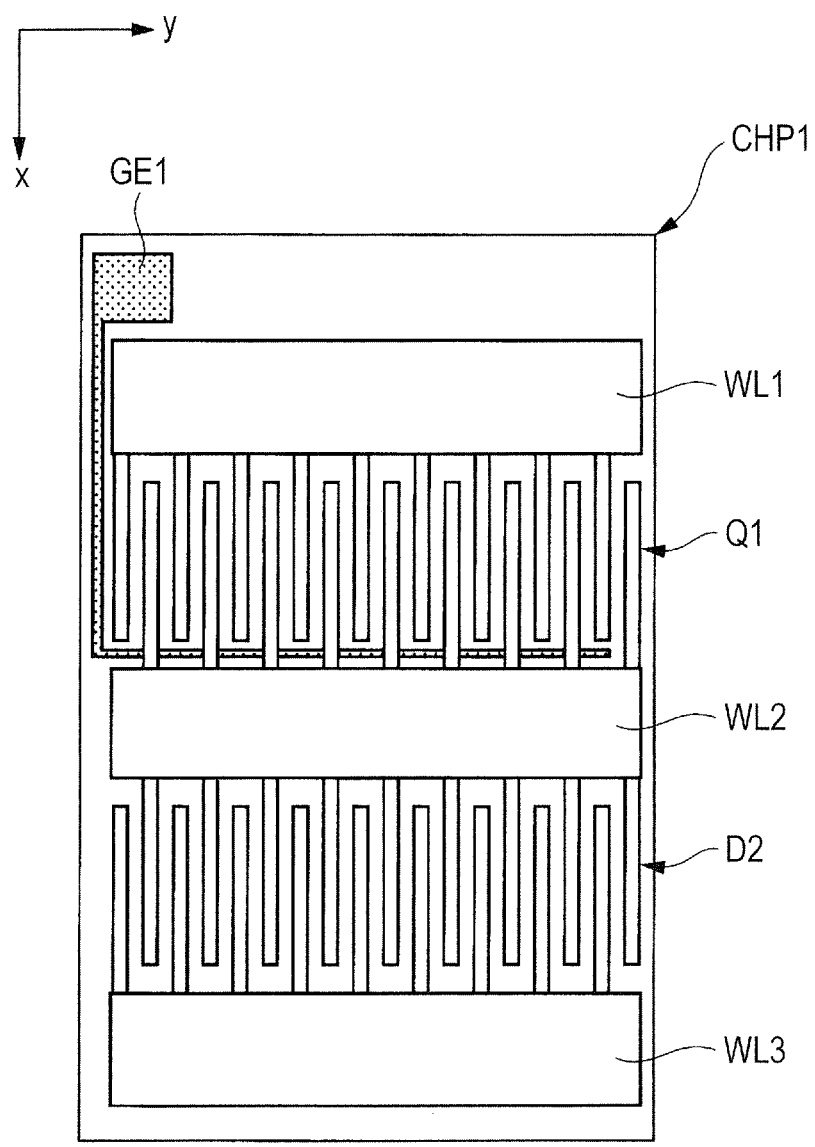
FIG. 11 is a plan view illustrating a layout structure of a semiconductor chip of Second embodiment.

Second Embodiment:

The following will describe the structure of a semiconductor device of the present embodiment, Second embodiment, referring to some of the drawings. FIG. 11 is a plan view illustrating a layout structure example of a semiconductor chip CHP1 in Second embodiment. In the semiconductor chip CHP1 in First embodiment, which is illustrated in FIG. 11, for example, the same constituent elements as in the unitary unit U1 illustrated in FIG. 2 are formed. Specifically, as illustrated in FIG. 11, in the semiconductor chip CHP1 in Second embodiment, a power transistor Q1 having a gate electrode GE1 and a diode D2 are arranged side by side in an x-direction. When viewed in plan, an interconnect WL1 and an interconnect WL2 are formed in such a manner that the power transistor Q1 is sandwiched therebetween.

The interconnects WL1 and WL2 are each extended in a y-direction. When viewed in plan, the interconnect WL2 and an interconnect WL3 are formed in such a manner that a diode D2 is sandwiched therebetween. The interconnects WL2 and WL3 are each extended in the y-direction.

In this way, also in the semiconductor chip CHP1 in Second embodiment, the layout characteristics described about First embodiment are realized. Specifically, in Second embodiment also, the following are realized: the power transistors Q1 and Q2 coupled to each other in series are formed in the same semiconductor chip (first contrivance); and a source of the power transistor Q1 and a cathode of the diode D2 coupled to this power transistor Q1 in series are made common to each other through the interconnect WL2, which is a single common interconnect (second contrivance).

Figure 12:
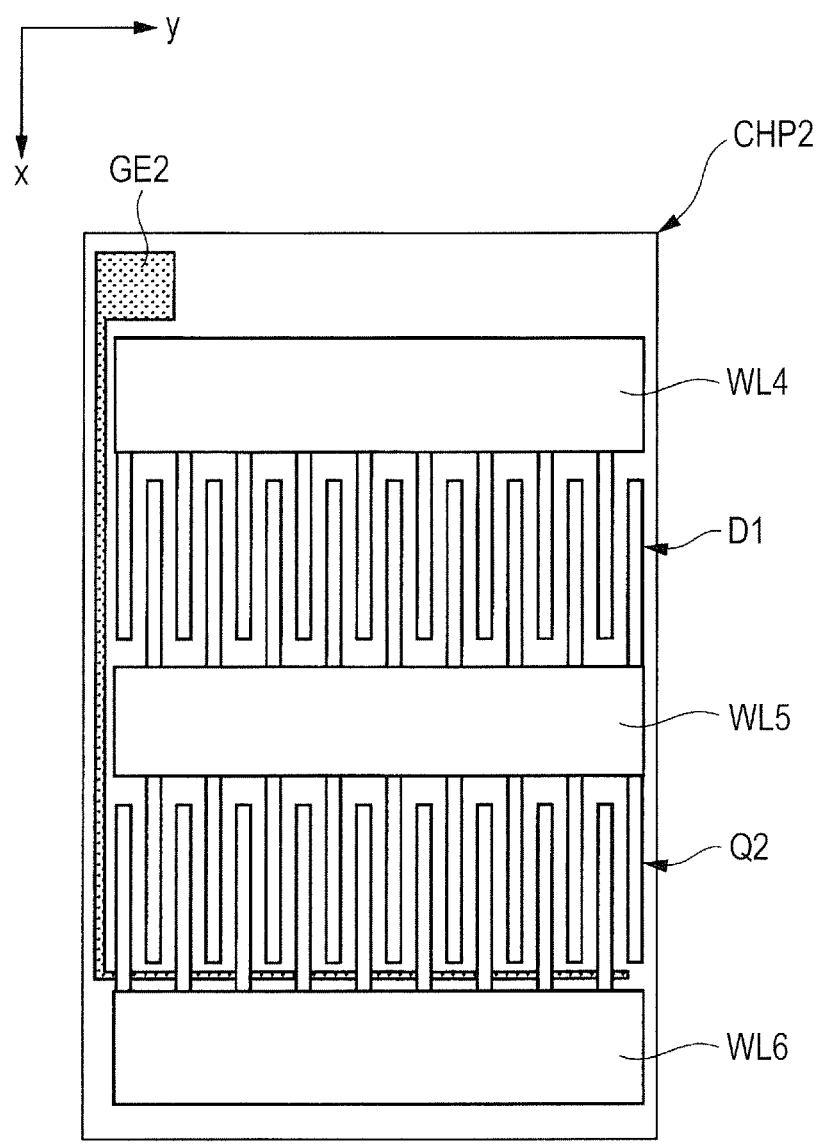
FIG. 12 is a plan view illustrating a layout structure of the semiconductor chip of Second embodiment.

FIG. 12 is a plan view illustrating a layout structure example of a semiconductor chip CHP2 in Second embodiment. In the semiconductor chip CHP2 in Second embodiment, which is illustrated in FIG. 12, for example, the same constituent elements as in the unitary unit U2 illustrated in FIG. 2 are formed. Specifically, as illustrated in FIG. 12, in the semiconductor chip CHP2 in Second embodiment, a diode D1 and a power transistor Q2 having a gate electrode GE2 are arranged side by side in an x-direction. When viewed in plan, an interconnect WL4 and an interconnect WL5 are formed in such a manner that a diode D1 is sandwiched therebetween. The interconnects WL4 and WL5 are each extended in a y-direction. When viewed in plan, the interconnect WL5 and an interconnect WL6 are formed in such a manner that a power transistor Q2 is sandwiched therebetween. The interconnects WL5 and WL6 are each extended in the y-direction.

In this way, also in the semiconductor chip CHP2 in Second embodiment, the layout characteristics described about First embodiment are realized. Specifically, in Second embodiment also, the following are realized: the diode D1 and the power transistor Q2 coupled to each other in series are formed in the same semiconductor chip (first contrivance); and an anode of the diode D1 and a drain of the power transistor Q2 coupled to this diode D1 in series are made common to each other through the interconnect WL5, which is a single common interconnect (second contrivance).

FIG. 13A to 13C are each a view illustrating the structure of the semiconductor device of Second embodiment. Specifically, FIG. 13B is a sectional view illustrating the structure of the semiconductor device of Second embodiment. FIG. 13A is a side view corresponding to a right-side side surface of the device in FIG. 13B, and FIG. 13C is a side view corresponding to a left-side side surface thereof in FIG. 13B.

As illustrated in FIGS. 13A to 13C, the semiconductor device of Second embodiment has, for example, a substrate WB, the semiconductor chip CHP1 and the semiconductor chip CHP2. The semiconductor chip CHP1 is mounted on the front surface of the substrate WB, and the semiconductor chip CHP2 is mounted on the rear surface of the substrate WB. As illustrated in FIGS. 13A to 13C, in the substrate WB, through-electrodes PLG1, PLG2 and PLG3 are formed which each penetrate the substrate WB. The interconnect WL1 formed in the semiconductor chip CHP1 is electrically coupled to the interconnect WL4 formed in the semiconductor chip CHP2 through the through-electrode PLG1. In the same manner, the interconnect WL2 formed in the semiconductor chip CHP1 is electrically coupled to the interconnect WL5 formed in the semiconductor chip CHP2 through the through-electrode PLG2, and the interconnect WL3 formed in the semiconductor chip CHP1 is electrically coupled to the interconnect WL6 formed in the semiconductor chip CHP2 through the through-electrode PLG3. In this way, a semiconductor device for realizing the half bridge circuit HB1 illustrated in FIG. 2 is formed. The thus formed semiconductor device of Second embodiment can also gain a parasite-inductance-decreasing effect in the same way as in First embodiment. This matter makes it possible to restrain the ringing of the switching waveform, which is caused by a parasite inductance. Accordingly, the semiconductor device of Second embodiment can also be improved in performance by a high-speed switching action.

Furthermore, according to Second embodiment, without forming the constituent elements of the half bridge circuit HB1 illustrated in FIG. 2 in a single semiconductor chip, unitary units U1 and U2 that are constituents elements of the half bridge circuit HB1 are formed in the different semiconductor chips (the semiconductor chips CHP1 and CHP2), respectively. For this reason, Second embodiment makes it possible to decrease the chip size (planar size) of each of the semiconductor chips to make the semiconductor device small in size.

The above has specifically described the invention made by the inventors by way of the embodiments thereof. However, the invention is not limited to the embodiments, and the embodiments can each be varied into various forms as far as the varied embodiment does not depart from the subject matters of the invention.

What is claimed is:

1. A semiconductor device comprising a semiconductor chip, the semiconductor chip comprising:
   a first power transistor,
   a first diode coupled to the first power transistor in antiparallel,
   a second diode coupled to the first power transistor in series, and
   a second power transistor coupled to the first diode in series, and further coupled to the second diode in antiparallel;
   wherein the first power transistor comprises:
      a first drain and a first source that are arranged apart from each other in plan view, and
      a first gate electrode that provides ON/OFF control of a current flowing between the first drain and the first source;
   wherein the second power transistor comprises:
      a second drain and a second source that are arranged apart from each other in plan view, and
      a second gate electrode that provides ON/OFF control of a current flowing between the second drain and the second source;
   wherein the first diode comprises:
      a first cathode coupled electrically to the first drain, and
      a first anode coupled electrically to the first source and the second drain;
   wherein the second diode comprises:
      a second cathode coupled electrically to the first source and the second drain, and
      a second anode coupled electrically to the second source,
   wherein the semiconductor chip comprises:
      a first interconnect functioning as the first drain of the first power transistor and the first cathode of the first diode,
      a second interconnect functioning as the first source of the first power transistor and the second cathode of the second diode, and further functioning as the second drain of the second power transistor and the first anode of the first diode, and
a third interconnect functioning as the second source of the second power transistor and the second anode of the second diode,
wherein the first power transistor and the first diode are arranged side by side in a first direction,
wherein the second diode and the second power transistor are arranged side by side in the first direction,
wherein the first power transistor and the second diode are arranged side by side in a second direction crossing the first direction,
wherein the first diode and the second power transistor are arranged side by side in the second direction, and
wherein the first to the third interconnects are extended in the first direction and are apart from each other.

2. The semiconductor device according to claim 1,
wherein a plurality of units, each comprising the first power transistor or the second power transistor, the first diode or the second diode, and the first, the second or the third interconnect, are formed in the semiconductor chip.

3. The semiconductor device according to claim 2,
wherein paired units of the units are formed in the semiconductor chip, and
wherein the paired units are constituent elements of a full bridge circuit.

4. The semiconductor device according to claim 1, comprising:
a first wire multipoint-bonded to the first interconnect,
a second wire multipoint-bonded to the second interconnect, and
a third wire multipoint-bonded to the third interconnect.

5. A semiconductor device comprising a semiconductor chip, the semiconductor chip comprising:
a first power transistor,
a first diode coupled to the first power transistor in antiparallel,
a second diode coupled to the first power transistor in series, and
a second power transistor coupled to the first diode in series, and further coupled to the second diode in antiparallel;
wherein the first power transistor comprises:
a first drain and a first source that are arranged apart from each other in plan view, and
a first gate electrode that provides ON/OFF control of a current flowing between the first drain and the first source;
wherein the second power transistor comprises:
a second drain and a second source that are arranged apart from each other in plan view, and
a second gate electrode that provides ON/OFF control of a current flowing between the second drain and the second source;
wherein the first diode comprises:
a first cathode coupled electrically to the first drain, and
a first anode coupled electrically to the first source and the second drain;
wherein the second diode comprises:
a second cathode coupled electrically to the first source and the second drain, and
a second anode coupled electrically to the second source,
wherein the semiconductor chip comprises:
a first interconnect functioning as the first drain of the first power transistor and the first cathode of the first diode,
a second interconnect functioning as the first source of the first power transistor and the second cathode of the second diode, and further functioning as the second drain of the second power transistor and the first anode of the first diode, and
a third interconnect functioning as the second source of the second power transistor and the second anode of the second diode,
wherein the first to the third interconnects are extended in a first direction and are apart from each other,
wherein the first power transistor and the second power transistor each comprise a plurality of unitary transistors coupled to each other in parallel,
wherein each of the unitary transistors comprises a drain electrode and a source electrode extended in a second direction crossing the first direction and are apart from each other in plan view,
wherein the drain electrode of each of the unitary transistors of the first power transistor is electrically coupled to the first interconnect functioning as the first drain,
wherein the source electrode of each of the unitary transistors of the first power transistor is electrically coupled to the second interconnect functioning as the first source,
wherein the drain electrode of each of the unitary transistors of the second power transistor is electrically coupled to the second interconnect functioning as the second drain, and
wherein the source electrode of each of the unitary transistors of the second power transistor is electrically coupled to the third interconnect functioning as the second source.

6. The semiconductor device according to claim 5,
wherein the semiconductor chip comprises an electron transit layer and an electron supply layer formed over the electron transit layer,
wherein a square well potential is formed in an interface between the electron transit layer and the electron supply layer, and
wherein the drain electrode and the source electrode of each of the unitary transistors are formed over the electron supply layer and are apart from each other.

7. The semiconductor device according to claim 6,
wherein the electron transit layer and the electron supply layer are each a nitride semiconductor layer.

8. The semiconductor device according to claim 5,
wherein a plurality of units each comprising the first power transistor or the second power transistor, the first diode or the second diode, and the first, the second or the third interconnect are formed in the semiconductor chip.

9. The semiconductor device according to claim 8,
wherein paired units of the units are formed in the semiconductor chip, and
wherein the paired units are constituent elements of a full bridge circuit.

10. The semiconductor device according to claim 5, comprising:
a first wire multipoint-bonded to the first interconnect,
a second wire multipoint-bonded to the second interconnect, and
a third wire multipoint-bonded to the third interconnect.

11. A semiconductor device comprising a semiconductor chip, the semiconductor chip comprising:
  a first power transistor,
  a first diode coupled to the first power transistor in antiparallel,
  a second diode coupled to the first power transistor in series, and
  a second power transistor coupled to the first diode in series, and further coupled to the second diode in antiparallel;
  wherein the first power transistor comprises:
    a first drain and a first source that are arranged apart from each other in plan view, and
    a first gate electrode that provides ON/OFF control of a current flowing between the first drain and the first source;
  wherein the second power transistor comprises:
    a second drain and a second source that are arranged apart from each other in plan view, and
    a second gate electrode that provides ON/OFF control of a current flowing between the second drain and the second source;
  wherein the first diode comprises:
    a first cathode coupled electrically to the first drain, and
    a first anode coupled electrically to the first source and the second drain;
  wherein the second diode comprises:
    a second cathode coupled electrically to the first source and the second drain, and
    a second anode coupled electrically to the second source,
  wherein the semiconductor chip comprises:
    a first interconnect functioning as the first drain of the first power transistor and the first cathode of the first diode,
    a second interconnect functioning as the first source of the first power transistor and the second cathode of the second diode, and further functioning as the second drain of the second power transistor and the first anode of the first diode, and
    a third interconnect functioning as the second source of the second power transistor and the second anode of the second diode,
  wherein the first to the third interconnects are extended in a first direction and are apart from each other,
  wherein the first diode and the second diode each comprise a plurality of unitary diodes coupled to each other in parallel,
  wherein, in plan view, each of the unitary diodes comprises an anode electrode and a cathode electrode extended in a second direction crossing the first direction,
  wherein the cathode electrode of each of the unitary diodes of the first diode is electrically coupled to the first interconnect functioning as the first cathode,
  wherein the anode electrode of each of the unitary diodes of the first diode is electrically coupled to the second interconnect functioning as the first anode,
  wherein the cathode electrode of each of the unitary diodes of the second diode is electrically coupled to the second interconnect functioning as the second cathode, and
  wherein the anode electrode of each of the unitary diodes of the second diode is electrically coupled to the third interconnect functioning as the second anode.

12. The semiconductor device according to claim 11,
  wherein the semiconductor chip comprises an electron transit layer and an electron supply layer formed over the electron transit layer,
  wherein a square well potential is formed in an interface between the electron transit layer and the electron supply layer,
  wherein the anode electrode and the cathode electrode of each of the unitary diodes are formed over the electron supply layer and are apart from each other, and
  wherein a Schottky junction region is formed which makes a Schottky junction with each of the electron transit layer and the electron supply layer.

13. The semiconductor device according to claim 11,
  wherein a plurality of units each comprising the first power transistor or the second power transistor, the first diode or the second diode, and the first, the second or the third interconnect are formed in the semiconductor chip.

14. The semiconductor device according to claim 13,
  wherein paired units of the units are formed in the semiconductor chip, and
  wherein the paired units are constituent elements of a full bridge circuit.

15. The semiconductor device according to claim 11, comprising:
  a first wire multipoint-bonded to the first interconnect,
  a second wire multipoint-bonded to the second interconnect, and
  a third wire multipoint-bonded to the third interconnect.

16. A semiconductor device comprising a semiconductor chip, the semiconductor chip comprising:
  a first power transistor,
  a first diode coupled to the first power transistor in antiparallel,
  a second diode coupled to the first power transistor in series, and
  a second power transistor coupled to the first diode in series, and further coupled to the second diode in antiparallel;
  wherein the first power transistor comprises:
    a first drain and a first source that are arranged apart from each other in plan view, and
    a first gate electrode that provides ON/OFF control of a current flowing between the first drain and the first source;
  wherein the second power transistor comprises:
    a second drain and a second source that are arranged apart from each other in plan view, and
    a second gate electrode that provides ON/OFF control of a current flowing between the second drain and the second source;
  wherein the first diode comprises:
    a first cathode coupled electrically to the first drain, and
    a first anode coupled electrically to the first source and the second drain;
  wherein the second diode comprises:
    a second cathode coupled electrically to the first source and the second drain, and
    a second anode coupled electrically to the second source,
  wherein the semiconductor chip comprises:
    a first interconnect functioning as the first drain of the first power transistor and the first cathode of the first diode,
    a second interconnect functioning as the first source of the first power transistor and the second cathode of the second diode, and further functioning as the second drain of the second power transistor and the first anode of the first diode, and
a third interconnect functioning as the second source of the second power transistor and the second anode of the second diode,
wherein the first to the third interconnects are extended in a first direction and are apart from each other, while being exposed from an insulating layer, and
wherein the semiconductor device comprises:
a first conductive member extended in the first direction and further electrically coupled to the first interconnect while being arranged from an upper region of the first interconnect to an upper region of the insulating layer,
a second conductive member extended in the first direction and further electrically coupled to the second interconnect while being arranged from an upper region of the second interconnect to an upper region of the insulating layer, and
a third conductive member extended in the first direction and further electrically coupled to the third interconnect while being arranged from an upper region of the third interconnect to an upper region of the insulating layer.

17. The semiconductor device according to claim 16, wherein the first conductive member is multipoint-bonded to the first interconnect,
wherein the second conductive member is multipoint-bonded to the second interconnect, and
wherein the third conductive member is multipoint-bonded to the third interconnect.

18. The semiconductor device according to claim 16, wherein a plurality of units each comprising the first power transistor or the second power transistor, the first diode or the second diode, and the first, the second or the third interconnect are formed in the semiconductor chip.

19. The semiconductor device according to claim 18, wherein paired units of the units are formed in the semiconductor chip, and
wherein the paired units are constituent elements of a full bridge circuit.

20. A semiconductor device, comprising:
a substrate,
a first semiconductor chip mounted over a surface of the substrate, and
a second semiconductor chip over a rear surface of the substrate that is opposite to the surface;
the first semiconductor chip comprising:
a first power transistor, and
a second diode coupled to the first power transistor in series;
the second semiconductor chip comprising:
a second power transistor, and
a first diode coupled to the second power transistor in series;
the first power transistor comprising:
a first drain and a first source arranged apart from each other in plan view, and
a first gate electrode that provides ON/OFF control of a current flowing between the first drain and the first source;
the second power transistor comprising:
a second drain and a second source arranged apart from each other in plan view, and
a second gate electrode that provides ON/OFF control of a current flowing between the second drain and the second source;
the first diode comprising:
a first cathode coupled electrically to the first drain, and
a first anode coupled electrically to the first source and the second drain; and
the second diode comprising:
a second cathode coupled electrically to the first source and the second drain, and
a second anode coupled electrically to the second source;
wherein the first semiconductor chip comprises:
a first interconnect functioning as the first drain of the first power transistor,
a second interconnect functioning as the first source of the first power transistor and the second cathode of the second diode, and
a third interconnect functioning as the second anode of the second diode;
wherein the second semiconductor chip comprises:
a fourth interconnect functioning as the first cathode of the first diode, and
a fifth interconnect functioning as the first anode of the first diode and the second drain of the second power transistor, and
a sixth interconnect functioning as the second source of the second power transistor;
wherein the first interconnect and the fourth interconnect are electrically coupled to each other through a first through-electrode penetrating the substrate;
wherein the second interconnect and the fifth interconnect are electrically coupled to each other through a second through-electrode penetrating the substrate; and
wherein the third interconnect and the sixth interconnect are electrically coupled to each other through a third through-electrode penetrating the substrate.

21. The semiconductor chip according to claim 20, wherein the first power transistor and the second diode formed in the first semiconductor chip are arranged side by side in a first direction,
wherein the first diode and the second power transistor formed in the second semiconductor chip are arranged side by side in the first direction,
wherein the first to the third interconnects formed in the first semiconductor chip are each extended in a second direction crossing the first direction, and
wherein the fourth to the sixth interconnects formed in the second semiconductor chip are each extended in the second direction.

* * * * *